(12) United States Patent
Iwata et al.

(10) Patent No.: US 12,108,498 B2
(45) Date of Patent: Oct. 1, 2024

(54) WAFER PLACEMENT TABLE

(71) Applicant: NGK INSULATORS, LTD., Nagoya (JP)

(72) Inventors: Yuma Iwata, Handa (JP); Seiya Inoue, Handa (JP); Reo Watanabe, Handa (JP)

(73) Assignee: NGK INSULATORS, LTD., Nagoya (JP)

( * ) Notice: Subject to any disclaimer, the term of this patent is extended or adjusted under 35 U.S.C. 154(b) by 228 days.

(21) Appl. No.: 17/305,170

(22) Filed: Jul. 1, 2021

(65) Prior Publication Data
US 2022/0124875 A1   Apr. 21, 2022

(30) Foreign Application Priority Data

Oct. 16, 2020   (JP) .................................. 2020-174774

(51) Int. Cl.
*H05B 3/06* (2006.01)
*H05B 1/02* (2006.01)
(Continued)

(52) U.S. Cl.
CPC ............. *H05B 3/06* (2013.01); *H05B 1/0233* (2013.01); *H05B 3/03* (2013.01); *H05B 3/283* (2013.01); *H05B 2203/035* (2013.01)

(58) Field of Classification Search
CPC .......... H05B 3/06; H05B 1/0233; H05B 3/03; H05B 3/283; H05B 2203/035
See application file for complete search history.

(56) References Cited

U.S. PATENT DOCUMENTS

| | | | | |
|---|---|---|---|---|
| 1,485,667 A | * | 3/1924 | Robson ..................... | H05B 3/06 219/520 |
| 6,376,808 B2 | * | 4/2002 | Tachikawa ............... | H05B 3/68 219/541 |

(Continued)

FOREIGN PATENT DOCUMENTS

| | | |
|---|---|---|
| CN | 110383432 A | 10/2019 |
| JP | 2003-133195 A1 | 5/2003 |

(Continued)

OTHER PUBLICATIONS

Korean Office Action (Application No. 10-2021-0089423) dated Mar. 23, 2023 (with English translation).

(Continued)

*Primary Examiner* — Janie M Loeppke
*Assistant Examiner* — Theodore J Evangelista
(74) *Attorney, Agent, or Firm* — BURR PATENT LAW, PLLC

(57) ABSTRACT

A wafer placement table includes a ceramic plate, an electrode embedded in the ceramic plate, a hollow ceramic shaft attached to a surface of the ceramic plate, a power-supplying member running inside the ceramic shaft and connected to a terminal of the electrode, a plate-side attaching site defined on the ceramic plate and to which the power-supplying member is attached, and a power-source-side attaching site defined at a free end of the ceramic shaft and to which the power-supplying member is attached. The power-source-side attaching site is defined in correspondence with the plate-side attaching site and in such a manner as to be shifted from the plate-side attaching site in plan view. The power-supplying member includes a redirecting portion where the power-supplying member extending from the power-source-side attaching site is forcibly redirected toward the plate-side attaching site.

5 Claims, 8 Drawing Sheets

(51) Int. Cl.
*H05B 3/03* (2006.01)
*H05B 3/28* (2006.01)

(56) References Cited

U.S. PATENT DOCUMENTS

| | | |
|---|---|---|
| 2001/0042744 A1 | 11/2001 | Tachikawa et al. |
| 2003/0075537 A1 | 4/2003 | Okajima et al. |
| 2008/0041842 A1 | 2/2008 | Alexander et al. |
| 2010/0170887 A1* | 7/2010 | Alexander ............. H01R 13/24 219/541 |
| 2019/0385827 A1* | 12/2019 | Takahara .......... H01L 21/67103 |
| 2020/0404747 A1* | 12/2020 | Sakamaki ................ H05B 3/06 |

FOREIGN PATENT DOCUMENTS

| | | | |
|---|---|---|---|
| JP | 2009182139 A | * | 8/2009 |
| KR | 10-2007-0028219 A | | 3/2007 |
| KR | 10-2019-0103403 A | | 9/2019 |

OTHER PUBLICATIONS

Korean Office Action (with English translation) dated Sep. 27, 2023 (Application No. 10-2021-0089423).
Chinese Office Action (Application No. 202111203612.7) dated Jan. 22, 2024 (with English translation) (15 pages).

* cited by examiner (Second fitting hole 62)

(RF fitting hole 63)

(First fitting hole 61)

Direction B (First fitting hole 61)

(First fitting hole 61)

WAFER PLACEMENT TABLE

BACKGROUND OF THE INVENTION

1. Field of the Invention

The present invention relates to a wafer placement table.

2. Description of the Related Art

Semiconductor manufacturing apparatuses employ ceramic heaters for heating wafers. One of such known ceramic heaters that is disclosed by PTL 1 includes a ceramic shaft joined to the back surface of a ceramic plate in which an inner-peripheral-side resistance heating element and an outer-peripheral-side resistance heating element are embedded. In this ceramic heater, the resistance heating elements are controllable for heat generation independently of each other by applying respective voltages thereto through respective power-supplying members.

CITATION LIST

Patent Literature

[PTL 1] Japanese Unexamined Patent Application Publication No. 2003-133195

SUMMARY OF THE INVENTION

Some of such ceramic heaters are configured as follows. An installation table on which the ceramic heater is installed has sites to which the power-supplying members are attached. The sites are arranged closer to one another than sites of the ceramic plate to which the power-supplying members are respectively attached. In such a case, the power-supplying members are bent inside the ceramic shaft. Therefore, a load (moment) is applied to a joint between a tablet, which is embedded in the ceramic heater, and each of the power-supplying members, leading to possible breakage of the joint. Such a problem may occur if the sites to which the power-supplying members are attached are shifted from the respective attaching sites defined on the ceramic shaft in plan view. There are some other cases where cables are employed as the power-supplying members. Cables are bendable but have relatively high rigidity. Therefore, the load applied to the joint cannot be reduced satisfactorily. Hence, the above problem cannot be solved satisfactorily.

The present invention is to solve the above problem and chiefly aims to provide a wafer placement table in which the disconnection of power-supplying members from terminals provided at plate-side attaching sites is prevented.

A wafer placement table of the present invention includes:
a ceramic plate having a wafer placement surface;
an electrode embedded in the ceramic plate;
a hollow ceramic shaft attached to a surface of the ceramic plate, the surface being opposite the wafer placement surface;
a power-supplying member running inside the ceramic shaft and connected to a terminal of the electrode, the power-supplying member conveying power from a power source to the electrode;
a plate-side attaching site defined on the ceramic plate and to which the power-supplying member is attached, the plate-side attaching site being defined in an area enclosed by the ceramic shaft and in correspondence with the terminal of the electrode; and
a power-source-side attaching site defined at a free end of the ceramic shaft and to which the power-supplying member is attached, the power-source-side attaching site being defined in correspondence with the plate-side attaching site and in such a manner as to be shifted from the plate-side attaching site in plan view,
wherein the power-supplying member includes a redirecting portion where the power-supplying member extending from the power-source-side attaching site is forcibly redirected toward the plate-side attaching site.

In the above wafer placement table, the plate-side attaching site and the power-source-side attaching site are shifted from each other in plan view. Furthermore, the power-supplying member includes the redirecting portion. The power-supplying member extending from the power-source-side attaching site is forcibly redirected by the redirecting portion toward the plate-side attaching site. The redirecting portion reduces a load (moment) applied to the power-supplying member and acting to disconnect the power-supplying member from the terminal provided at the plate-side attaching site. Therefore, the disconnection of the power-supplying member from the terminal can be prevented. The power-source-side attaching site only needs to be defined on a side of the ceramic shaft that is near the free end. For example, the power-source-side attaching site may be a hole provided in a member attached to the free end of the ceramic shaft. If such a member is not provided, the power-source-side attaching site may be defined in a space near the free end of the ceramic shaft.

The wafer placement table according to the present invention may be configured as follows: the electrode is one of a plurality of electrodes including a heater electrode, the power-supplying member is one of a plurality of power-supplying members respectively connected to the terminals of the plurality of electrodes, the plate-side attaching site is one of a plurality of plate-side attaching sites defined in the area and in correspondence with the terminals of the plurality of electrodes, the power-source-side attaching site is one of a plurality of power-source-side attaching sites defined in correspondence with the plurality of plate-side attaching sites, with at least one of the plurality of power-source-side attaching sites being shifted from a corresponding one of the plate-side attaching sites in plan view, and the redirecting portion is provided to one of the plurality of power-supplying members that extends between the power-source-side attaching site and the plate-side attaching site that are shifted from each other. In such a configuration, the power-supplying member extending between the power-source-side attaching site and the plate-side attaching site that are shifted from each other in plan view can be prevented from being disconnected from a corresponding one of the terminals.

In the above configuration, the plurality of power-source-side attaching sites may all be shifted from the respective plate-side attaching sites in plan view. In such a configuration, all of the power-supplying members can be held in such a manner as to be forcibly redirected by the redirecting portions. Furthermore, the power-supplying members may each include a flange near the ceramic plate. The flange of the power-supplying member is used in pushing the power-supplying member toward the plate-side attaching site when, for example, the power-supplying member is pressure-bonded or thermally pressure-bonded to the plate-side attaching site. The flange has a diameter greater than the diameter of the power-supplying member. The flanges of adjacent ones of the power-supplying members need to be insulated from each other. Furthermore, the occurrence of creeping discharge between adjacent ones of the plate-side attaching sites need to be prevented. Therefore, if the power-supplying members including the flanges are employed, the plate-side attaching sites need to be arranged farther from one another than the power-source-side attaching sites (in other words, the power-source-side attaching sites need to be arranged closer to one another than the plate-side attaching sites). Consequently, each of the plate-side attaching sites and a corresponding one of the power-source-side attaching sites tend to be shifted from each other in plan view. Such a configuration is suitable for the application of the present invention. As to be described below, if the power-supplying members each include a metal component including a body portion and a cable-holding portion, the flange may be provided at the boundary between the body portion and the cable-holding portion.

The wafer placement table according to the present invention may be configured as follows: the power-supplying member includes a metal component and a cable, the metal component being joined to the terminal of the electrode, the cable being joined to the metal component and extending from the metal component to the power-source-side attaching site, the metal component serving as the redirecting portion. In such a configuration, the use of the metal component serving as the redirecting portion eliminates the need for providing the redirecting portion in addition to the metal component. The metal component is highly rigid and unbendable. The cable is rigid but bendable. The cable may include a rod at an end thereof opposite the end thereof joined to the metal component, and the rod may be attached to the power-source-side attaching site.

In the above wafer placement table, the metal component may include a body portion extending from the plate-side attaching site and in an axial direction of the ceramic shaft; and a cable-holding portion integrated with the body portion and that holds the cable while forcibly and obliquely bending the cable extending from the power-source-side attaching site and in the axial direction of the ceramic shaft.

Alternatively, the metal component may include a body portion extending from the plate-side attaching site and in an axial direction of the ceramic shaft; and a cable-holding portion integrated with the body portion while being shifted from the body portion in a direction orthogonal to the axial direction of the ceramic shaft, the cable-holding portion holding the cable while keeping a natural orientation of the cable extending from the power-source-side attaching site and in the axial direction of the ceramic shaft. Such a configuration includes no portion where the cable is forcibly bent. Hence, there is no chance that a load (moment) acting to disconnect the power-supplying member from the terminal provided at the plate-side attaching site is applied to the power-supplying member.

In the wafer placement table according to the present invention, the power-supplying member may be soldered to the terminal of the electrode. Such a soldered joint is more likely to be broken at the application of a load to the power-supplying member than a mechanical joint using screws or the like, and is therefore suitable for the application of the present invention.

DETAILED DESCRIPTION OF THE INVENTION

Figure 1:
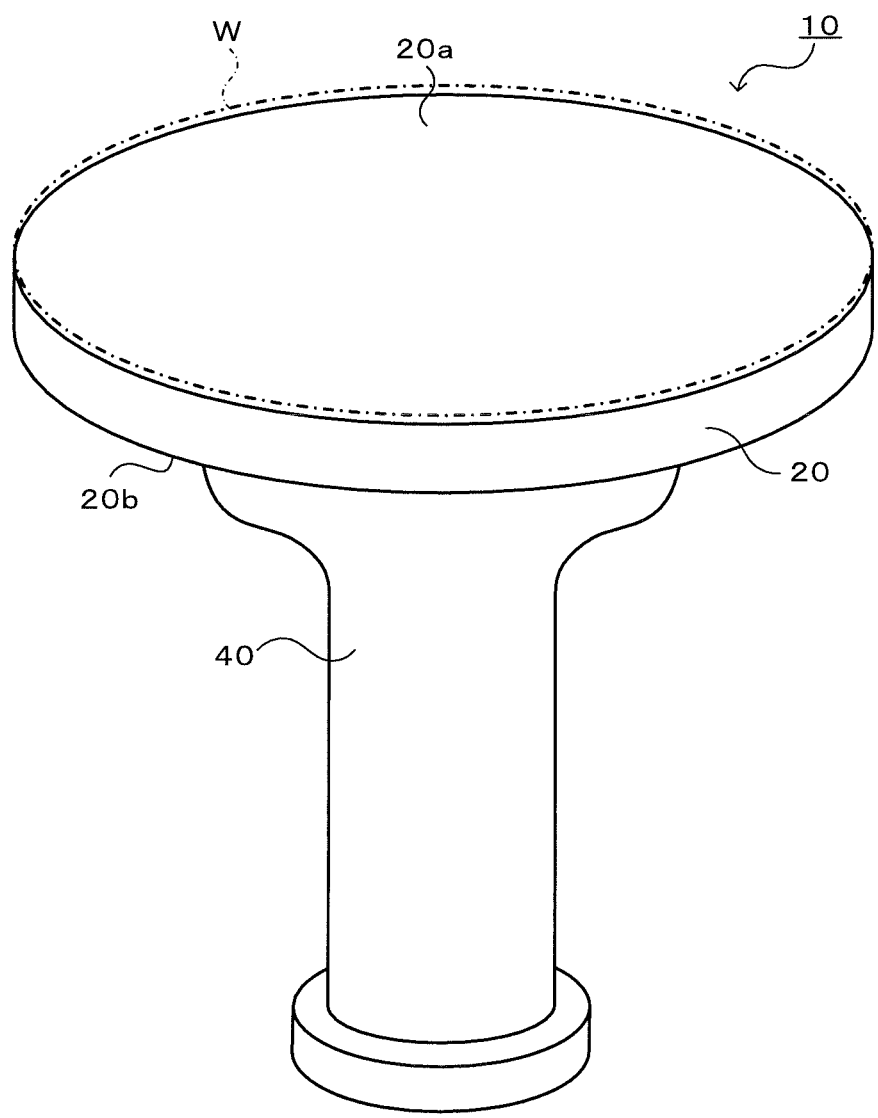
FIG. 1 is a perspective view of a ceramic heater 10.
Figure 2:
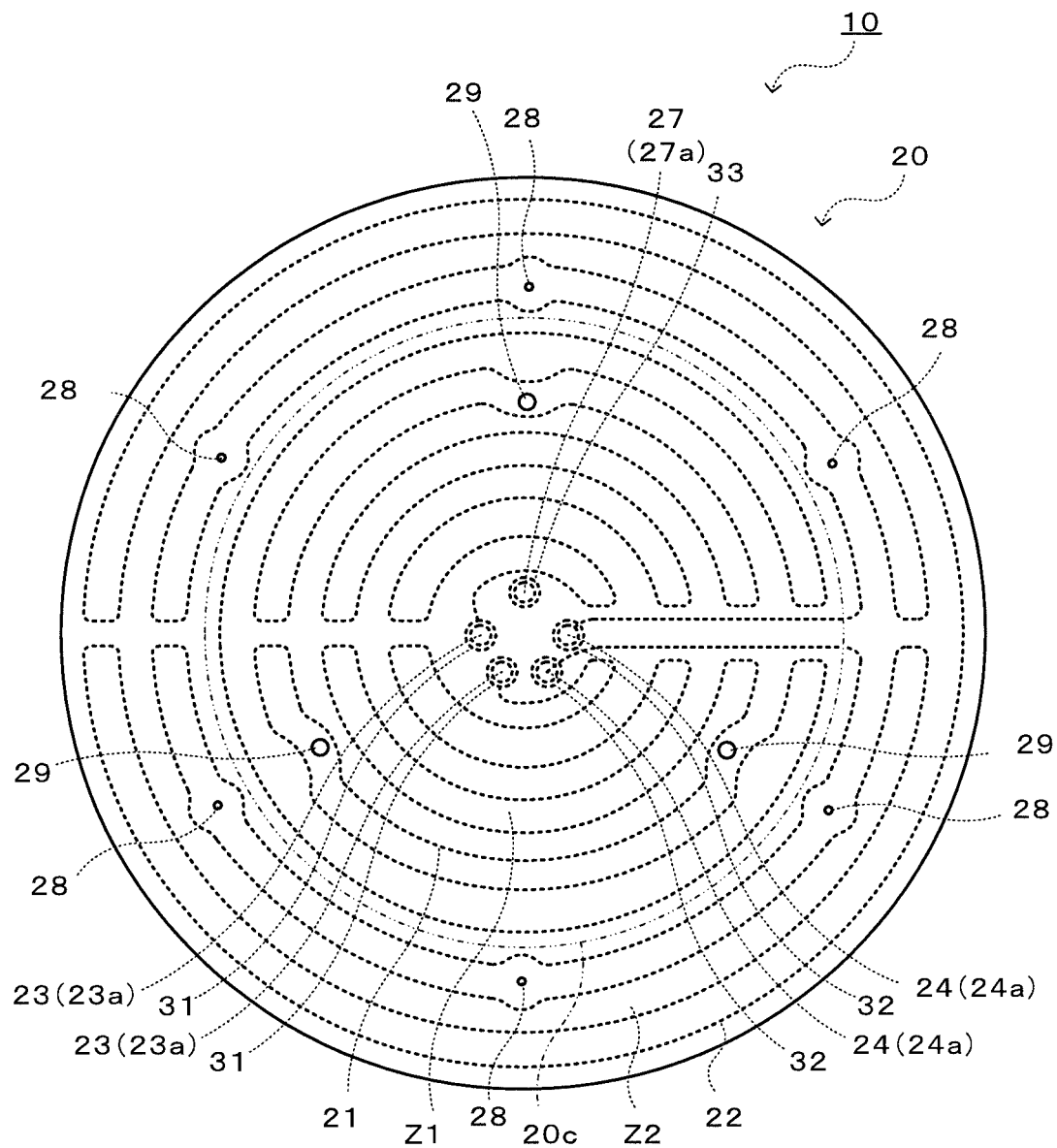
FIG. 2 is a plan view of a ceramic plate 20.
Figure 3:
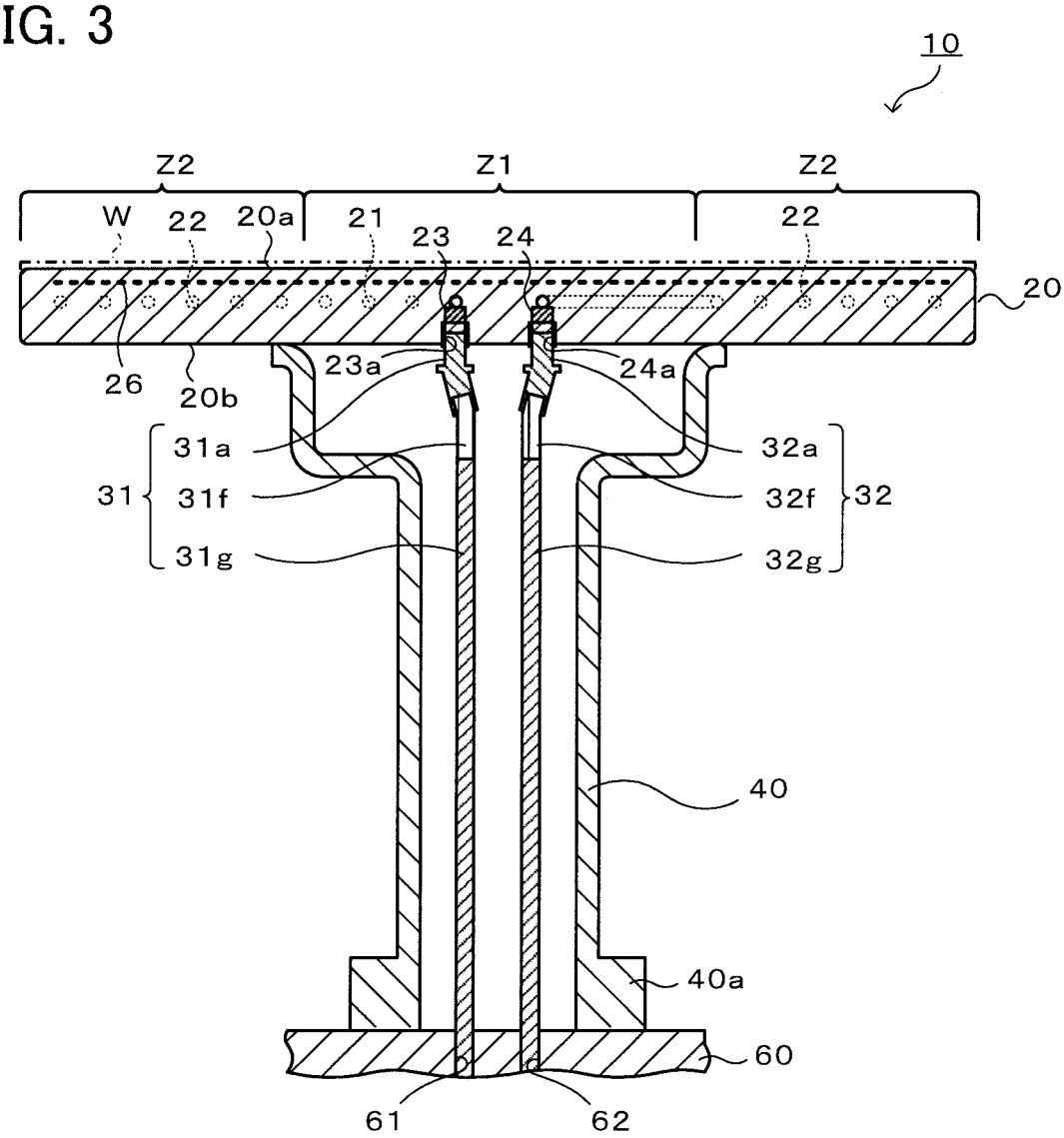
FIG. 3 is a longitudinal sectional view of the ceramic heater 10.
Figure 4:
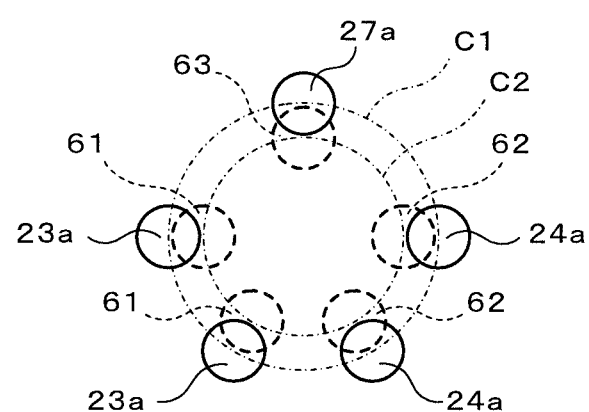
FIG. 4 is a schematic diagram illustrating a positional relationship between terminal holes 23a, 24a, and 27a and fitting holes 61 to 63 in plan view.
Figure 5:
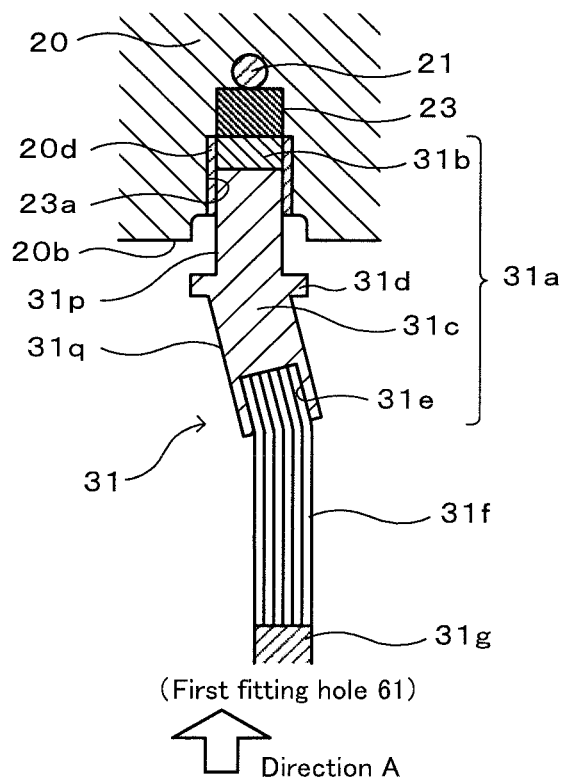
FIG. 5 is an enlargement of a part of FIG. 3.
Figure 6:
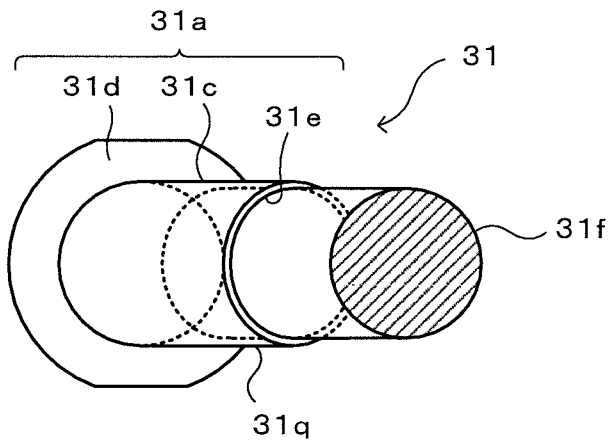
FIG. 6 is a view in direction A represented in FIG. 5.
Figure 7:
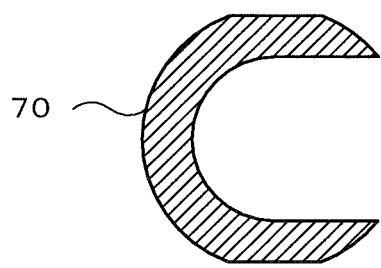
FIG. 7 is a sectional view of a pushing jig 70.
Figure 8:
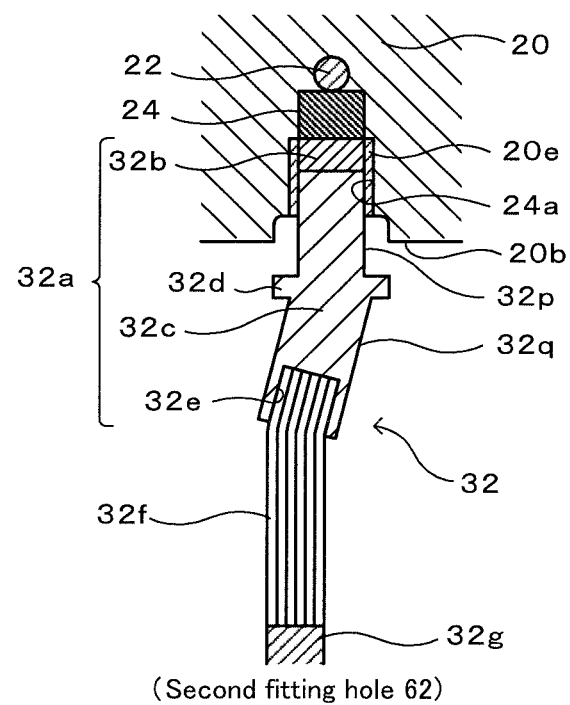
FIG. 8 is an enlargement of another part of FIG. 3.
Figure 9:
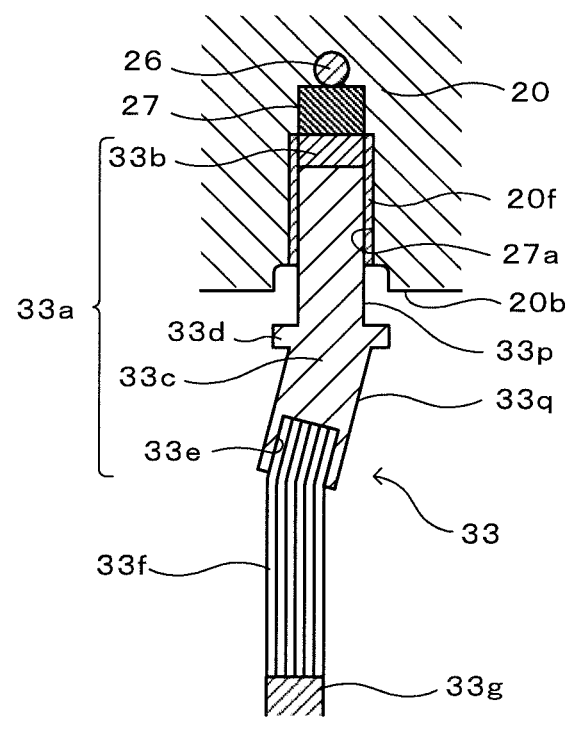
FIG. 9 is a longitudinal sectional view of an RF power-supplying member 33, illustrating the distal end thereof and elements therearound.

Preferred embodiments of the present invention will now be described with reference to the drawings. FIG. 1 is a perspective view of a ceramic heater 10. FIG. 2 is a plan view of a ceramic plate 20. FIG. 3 is a longitudinal sectional view of the ceramic heater 10 (a sectional view taken along a plane containing the center axis of the ceramic heater 10). FIG. 4 is a schematic diagram illustrating a positional relationship between terminal holes 23a, 24a, and 27a and fitting holes 61 to 63 in plan view. FIG. 5 is an enlargement of a part of FIG. 3 (a longitudinal sectional view of one of first power-supplying members 31, illustrating the distal end thereof and elements therearound). FIG. 6 is a view in direction A represented in FIG. 5. FIG. 7 is a sectional view of a pushing jig 70. FIG. 8 is an enlargement of another part of FIG. 3 (a longitudinal sectional view of one of second power-supplying members 32, illustrating the distal end thereof and elements therearound). FIG. 9 is a longitudinal sectional view of an RF power-supplying member 33, illustrating the distal end thereof and elements therearound. Illustration of elements, namely an RF electrode 26; a ceramic shaft 40; and so forth, by hidden lines is omitted in FIG. 2.

The ceramic heater 10 is an example of the wafer placement table according to the present invention. The ceramic heater 10 is used for heating a wafer W to be subjected to treatment such as etching or CVD and is installed in a vacuum chamber (not illustrated). The ceramic heater 10 includes the ceramic plate 20 and the ceramic shaft 40. The ceramic plate 20 has a disc shape with a wafer placement surface 20a. The ceramic shaft 40 has a cylindrical shape and is joined to a surface (back surface) 20b of the ceramic plate 20 that is opposite the wafer placement surface 20a. The ceramic shaft 40 is concentric with the ceramic plate 20.

The ceramic plate 20 is a disc-shaped plate made of a ceramic material such as aluminum nitride or alumina. The ceramic plate 20 has a diameter of, for example, about 300 mm. The wafer placement surface 20a of the ceramic plate 20 is embossed to have fine irregularities (not illustrated). The ceramic plate 20 is sectioned by a virtual boundary 20c (see FIG. 2), which is a circle concentric with the ceramic plate 20, into a small-circular first zone Z1 on the inner peripheral side and an annular second zone Z2 on the outer peripheral side. The virtual boundary 20c has a diameter of, for example, about 200 mm. The ceramic plate 20 has a first heater electrode 21 embedded in the first zone Z1, and a second heater electrode 22 embedded in the second zone Z2. The heater electrodes 21 and 22 are positioned in a common plane parallel to the wafer placement surface 20a. The ceramic plate 20 further has the RF electrode 26 (see FIG. 3) embedded therein.

As illustrated in FIG. 2, the ceramic plate 20 has a plurality of gas holes 28. The gas holes 28 extend through the ceramic plate 20 from the back surface 20b to the wafer placement surface 20a and allow gas to be supplied into gaps between the wafer W to be placed on the wafer placement surface 20a and the irregularities provided in the wafer placement surface 20a. The gas supplied into the gaps contributes to good heat conduction between the wafer placement surface 20a and the wafer W. The ceramic plate 20 further has a plurality of lift-pin holes 29. The lift-pin holes 29 extend through the ceramic plate 20 from the back surface 20b to the wafer placement surface 20a and receive lift pins (not illustrated) to be respectively inserted thereinto. The lift pins lift the wafer W placed on the wafer placement surface 20a. In the present embodiment, three lift-pin holes 29 are provided at regular intervals on the circumference of a common circle.

As illustrated in FIG. 2, the first heater electrode 21 is a resistance heating element that forms a one-stroke pattern extending from one of a pair of first terminals 23 that are provided in a central part of the ceramic plate 20 (within an area of the back surface 20b of the ceramic plate 20 that is enclosed by the ceramic shaft 40). The pattern makes a plurality of turns in such a manner as to spread over substantially the entirety of the first zone Z1 and eventually reach the other of the pair of first terminals 23. The resistance heating element forming the first heater electrode 21 forms the pattern while avoiding the lift-pin holes 29. The resistance heating element is chiefly made of high-melting-point metal or a carbide thereof. Examples of high-melting-point metal include tungsten, molybdenum, tantalum, platinum, rhenium, hafnium, and alloys of any of the foregoing materials. Examples of the carbide of high-melting-point metal include tungsten carbide, molybdenum carbide, and so forth. The first terminals 23 are exposed at the bottoms of respective first terminal holes 23a provided in the back surface 20b of the ceramic plate 20. The first terminals 23 are made of the same material as the resistance heating element. The distal ends of the first power-supplying members 31 are respectively fitted into the first terminal holes 23a and are respectively soldered to the first terminals 23.

As illustrated in FIG. 2, the second heater electrode 22 is a resistance heating element that forms a one-stroke pattern extending from one of a pair of second terminals 24 that are provided in the central part of the ceramic plate 20. The pattern makes a plurality of turns in such a manner as to spread over substantially the entirety of the second zone Z2 and eventually reach the other of the pair of second terminals 24. The resistance heating element forming the second heater electrode 22 forms the pattern while avoiding the gas holes 28. The resistance heating element is chiefly made of high-melting-point metal or a carbide thereof. A part of the resistance heating element that extends between each of the second terminals 24 and the second zone Z2 is formed of a wire made of high-melting-point metal or a carbide thereof. The second terminals 24 are exposed at the bottoms of respective second terminal holes 24a provided in the back surface 20b of the ceramic plate 20. The second terminals 24 are made of the same material as the resistance heating element. The distal ends of the second power-supplying members 32 are respectively fitted into the second terminal holes 24a and are respectively soldered to the second terminals 24.

The RF electrode 26 is a disc-shaped thin-film electrode having a slightly smaller diameter than the ceramic plate 20 and is made of thin metal wires woven into a mesh sheet. As illustrated in FIG. 3, the RF electrode 26 is embedded in the ceramic plate 20 between the wafer placement surface 20a and the first and second heater electrodes 21 and 22. The RF electrode 26 extends substantially parallel to the wafer placement surface 20a. The RF electrode 26 is chiefly made of high-melting-point metal or a carbide thereof. An RF terminal 27 of the RF electrode 26 is exposed at the bottom of an RF terminal hole 27a provided in the back surface 20b of the ceramic plate 20 (see FIG. 9). The RF terminal 27 is made of the same material as the RF electrode 26. The distal end of the RF power-supplying member 33 is fitted into the RF terminal hole 27a and is soldered to the RF terminal 27.

As illustrated in FIG. 4, the distance between the adjacent first terminal holes 23a, the distance between the adjacent second terminal holes 24a, the distance between one of the first terminal holes 23a and one of the second terminal holes 24a that is adjacent thereto, the distance between the RF terminal hole 27a and the other first terminal hole 23a adjacent thereto, and the distance between the RF terminal hole 27a and the other second terminal hole 24a adjacent thereto are set relatively long. The centers of the two first terminal holes 23a, the centers of the two second terminal holes 24a, and the center of the one RF terminal hole 27a are positioned on a circumference C1 of a circle having a diameter D1.

As with the ceramic plate 20, the ceramic shaft 40 is made of ceramic such as aluminum nitride or alumina. The ceramic shaft 40 has an inside diameter of, for example, about 40 mm and an outside diameter of, for example, about 60 mm. The upper end of the ceramic shaft 40 is joined to the ceramic plate 20. The ceramic shaft 40 houses the first power-supplying members 31 respectively connected to the pair of first terminals 23 of the first heater electrode 21, the second power-supplying members 32 respectively connected to the pair of second terminals 24 of the second heater electrode 22, and the RF power-supplying member 33 connected to the RF terminal 27. The first power-supplying members 31 are connected to a first power source (not illustrated). The second power-supplying members 32 are connected to a second power source (not illustrated). The RF power-supplying member 33 is connected to an RF power source (not illustrated). Therefore, the temperature of the first zone Z1 to be heated by the first heater electrode 21 and the temperature of the second zone Z2 to be heated by the second heater electrode 22 are individually controllable. The power sources are provided outside an installation table 60.

As illustrated in FIG. 3, the ceramic shaft 40 is fixed to the installation table 60. Specifically, a flange portion 40a provided at a free end (the lower end) of the ceramic shaft 40 is mechanically fixed to the installation table 60 with screws or the like. An area of the upper surface of the installation table 60 that is enclosed by the ceramic shaft 40 is provided with first fitting holes 61 into which the first power-supplying members 31 are fitted, second fitting holes 62 into which the second power-supplying members 32 are fitted, and an RF fitting hole 63 (see FIG. 4) into which the RF power-supplying member 33 is fitted. As illustrated in FIG. 4, the centers of the two first fitting holes 61, the centers of the two second fitting holes 62, and the center of the one RF fitting hole 63 are positioned on a circumference C2 of a circle having a diameter D2 (<D1). The first fitting holes 61, the second fitting holes 62, and the RF fitting hole 63 are arranged closer to one another than the first terminal holes 23a, the second terminal holes 24a, and the RF terminal hole 27a. Specifically, the distance between the adjacent first fitting holes 61 is shorter than the distance between the adjacent first terminal holes 23a, the distance between the adjacent second fitting holes 62 is shorter than the distance between the adjacent second terminal holes 24a, and the distance between one of the first fitting holes 61 and one of the second fitting holes 62 that is adjacent thereto is shorter than the distance between one of the first terminal holes 23a and one of the second terminal holes 24a that is adjacent thereto. Furthermore, the distance between the RF fitting hole 63 and the other first fitting hole 61 adjacent thereto is shorter than the distance between the RF terminal hole 27a and the other first terminal hole 23a adjacent thereto, and the distance between the RF fitting hole 63 and the other second fitting hole 62 adjacent thereto is shorter than the distance between the RF terminal hole 27a and the other second terminal hole 24a adjacent thereto.

As illustrated in FIGS. 5 and 6, the first power-supplying members 31 each include a metal component 31a, a cable 31f, and a rod 31g. The first terminal holes 23a provided in the back surface 20b of the ceramic plate 20 each receive a cylindrical member 20d to be fitted therein. The cylindrical member 20d is made of metal (Ni, for example). The distal end of the metal component 31a is fitted into the cylindrical member 20d and is soldered to the first terminal 23. The metal component 31a is a highly rigid, unbendable component and includes a buffer member 31b and an oxidation-resistant conductive member 31c. The buffer member 31b is provided on the distal side of the metal component 31a. The buffer member 31b is used for reducing the difference in thermal expansion between the first terminal 23 and the oxidation-resistant conductive member 31c. Examples of the material for the buffer member 31b include Kovar. The oxidation-resistant conductive member 31c includes a flange 31d and has an insertion hole 31e. The flange 31d is used in soldering the first power-supplying member 31 to the first terminal 23. The insertion hole 31e receives the cable 31f that is insertable thereinto. Examples of the material for the oxidation-resistant conductive member 31c include nickel. The cable 31f is, for example, a rigid but bendable conductive cable formed of thin nickel wires that are twisted together. The cable 31f is inserted into the insertion hole 31e and is joined to the metal component 31a. The rod 31g is, for example, a nickel rod and is joined to the lower end of the cable 31f. A portion (body portion 31p) of the metal component 31a that is nearer to the ceramic plate 20 than the flange 31d extends from the first terminal hole 23a and vertically along the axis of the ceramic shaft 40. A portion (cable-holding portion 31q) of the metal component 31a that is nearer to the installation table 60 than the flange 31d has the insertion hole 31e. The cable-holding portion 31q, inclusive of the insertion hole 31e, extends downward from the flange 31d and obliquely with respect to the axis of the ceramic shaft 40. Therefore, the cable-holding portion 31q holds the cable 31f while forcibly and obliquely bending the cable 31f extending from the first fitting hole 61 and in the axial direction of the ceramic shaft 40. Thus, the metal component 31a forcibly redirects the first power-supplying member 31, extending from the first fitting hole 61, toward the first terminal hole 23a.

To join the first power-supplying member 31 to the first terminal 23, the distal end face of the metal component 31a and the first terminal 23 are thermally pressure-bonded to each other with solder interposed in between. The pressure is applied by pushing the flange 31d of the metal component 31a toward the first terminal 23 with a stick-like pushing jig 70 having a C-shaped cross section as illustrated in FIG. 7. The pushing with the pushing jig 70 is performed after the pushing jig 70, having a cut, is fitted onto the cable-holding portion 31q of the metal component 31a through the cut. The pushing is performed with the flange 31d and the pushing jig 70 being in contact with each other.

As illustrated in FIG. 8, the second power-supplying members 32 each include a metal component 32a, a cable 32f, and a rod 32g. The second terminal holes 24a provided in the back surface 20b of the ceramic plate 20 each receive a cylindrical member 20e to be fitted therein. The cylindrical member 20e is made of metal (Ni, for example). The distal end of the metal component 32a is fitted into the cylindrical member 20e and is soldered to the second terminal 24. The metal component 32a is the same as the metal component 31a. Therefore, description of a buffer member 32b, an oxidation-resistant conductive member 32c, a flange 32d, an insertion hole 32e, a body portion 32p, and a cable-holding portion 32q is omitted. The cable 32f and the rod 32g are also the same as the cable 31f and the rod 31g respectively, and description thereof is omitted. In the second power-supplying member 32 as well, the cable-holding portion 32q holds the cable 32f while forcibly and obliquely bending the cable 32f extending from the second fitting hole 62 and in the axial direction of the ceramic shaft 40. Thus, the metal component 32a forcibly redirects the second power-supplying member 32, extending from the second fitting hole 62, toward the second terminal hole 24a. The process of joining the second power-supplying member 32 to the second terminal 24 is the same as the process of joining the first power-supplying member 31 to the first terminal 23. Therefore, description of the process is omitted.

As illustrated in FIG. 9, the RF power-supplying member 33 includes a metal component 33a, a cable 33f, and a rod 33g. The RF terminal hole 27a provided in the back surface 20b of the ceramic plate 20 receives a cylindrical member 20f to be fitted therein. The cylindrical member 20f is made of metal (Ni, for example). The distal end of the metal component 33a is fitted into the cylindrical member 20f and is soldered to the RF terminal 27. The metal component 33a is the same as the metal component 31a. Therefore, description of a buffer member 33b, an oxidation-resistant conductive member 33c, a flange 33d, an insertion hole 33e, a body portion 33p, and a cable-holding portion 33q is omitted. The RF terminal hole 27a is deeper than the first terminal hole 23a. Correspondingly, the body portion 33p is longer than the body portion 31p. The cable 33f and the rod 33g are also the same as the cable 31f and the rod 31g respectively, and description thereof is omitted. In the RF power-supplying member 33 as well, the cable-holding portion 33q holds the cable 33f while forcibly and obliquely bending the cable 33f extending from the RF fitting hole 63 and in the axial direction of the ceramic shaft 40. Thus, the metal component 33a forcibly redirects the RF power-supplying member 33, extending from the RF fitting hole 63, toward the RF terminal hole 27a. The process of joining the RF power-supplying member 33 to the RF terminal 27 is the same as the process of joining the first power-supplying member 31 to the first terminal 23. Therefore, description of the process is omitted.

To keep the adjacent first power-supplying members 31 insulated from each other, the respective flanges 31d need to be kept insulated from each other. Furthermore, the occurrence of creeping discharge between the first terminal holes 23a need to be prevented. Therefore, a relatively long distance needs to be provided between the first terminal holes 23a. This also applies to the case of the adjacent second terminal holes 24a, the case of one of the first terminal holes 23a and one of the second terminal holes 24a that is adjacent thereto, the case of the RF terminal hole 27a and the other first terminal hole 23a adjacent thereto, and the case of the RF terminal hole 27a and the other second terminal hole 24a adjacent thereto.

The first power-supplying members 31 extend from the respective first fitting holes 61 provided on the power-source side, are forcibly redirected at the obliquely extending insertion holes 31e of the respective metal components 31a, and eventually reach the respective first terminal holes 23a. That is, the first power-supplying members 31 are forcibly bent at the open ends of the respective insertion holes 31e. This also applies to the second power-supplying members 32 and the RF power-supplying member 33. The power-supplying members 31 to 33 extend from the respective fitting holes 61 to 63 provided in the installation table 60 and arranged relatively close to one another, are forcibly bent at the open ends of the insertion holes 31e to 33e of the respective metal components 31a to 33a, and eventually reach the respective terminal holes 23a, 24a, and 27a provided in the ceramic plate 20 and arranged relatively far from one another. Therefore, the forces generated by bending the cables 31f to 33f are not (or hardly) applied to the joints between the first terminals 23 and the first power-supplying members 31, the joints between the second terminals 24 and the second power-supplying members 32, and the joint between the RF terminal 27 and the RF power-supplying member 33.

Now, a usage of the ceramic heater 10 will be described. First, the ceramic heater 10 is installed on the installation table 60 provided in a vacuum chamber (not illustrated), and a shower head (not illustrated) is positioned above the wafer placement surface 20a with a space provided in between. Furthermore, a wafer W is placed on the wafer placement surface 20a. Subsequently, the power to be supplied to the first heater electrode 21 is adjusted by the first power source (not illustrated) such that the temperature of the first zone Z1 that is detected by an inner-peripheral-side thermocouple (not illustrated) becomes a predetermined inner-peripheral-side target temperature. Simultaneously, the power to be supplied to the second heater electrode 22 is adjusted by the second power source (not illustrated) such that the temperature of the second zone Z2 that is detected by an outer-peripheral-side thermocouple (not illustrated) becomes a predetermined outer-peripheral-side target temperature. Thus, the wafer W is controlled to have a desired temperature. Subsequently, the atmosphere in the vacuum chamber is set to a vacuum atmosphere or a decompressed atmosphere. Furthermore, RF power is supplied from the RF power source to the RF electrode 26. Thus, plasma is generated between parallel flat electrodes, which are the shower head and the RF electrode 26. The plasma thus generated is used in performing CVD or etching to be performed on the wafer W.

Now, the correspondence between (some of) the elements according to the present embodiment and (some of) the elements according to the present invention will be described. The first heater electrode 21, the second heater electrode 22, and the RF electrode 26 according to the present embodiment each correspond to the electrode according to the present invention. The first power-supplying members 31, the second power-supplying members 32 and the RF power-supplying member 33 each correspond to the power-supplying member. The first terminal holes 23a, the second terminal holes 24a, and the RF terminal hole 27a each correspond to the plate-side attaching site. The first fitting holes 61, the second fitting holes 62, and the RF fitting hole 63 each correspond to the power-source-side attaching site. The cable-holding portions 31q to 33q of the metal components 31a to 33a each correspond to the redirecting portion.

In the ceramic heater 10 according to the present embodiment described above, as illustrated in plan view in FIG. 4, each of the fitting holes and a corresponding one of the terminal holes (the first fitting holes 61 and the first terminal holes 23a, the second fitting holes 62 and the second terminal holes 24a, and the RF fitting hole 63 and the RF terminal hole 27a) are shifted from each other. In the present embodiment, the first fitting holes 61, the second fitting holes 62, and the RF fitting hole 63 are arranged closer to one another than the first terminal holes 23a, the second terminal holes 24a, and the RF terminal hole 27a. The first power-supplying members 31, the second power-supplying members 32, and the RF power-supplying member 33 include the respective metal components 31a to 33a, which also serve as the redirecting portions. The metal components 31a forcibly redirect the first power-supplying members 31, extending from the first fitting holes 61, toward the first terminal holes 23a. The metal components 32a forcibly redirect the second power-supplying members 32, extending from the second fitting holes 62, toward the second terminal holes 24a. The metal component 33a forcibly redirects the RF power-supplying member 33, extending from the RF fitting hole 63, toward the RF terminal hole 27a. The metal components 31a to 33a reduce loads (moments) applied to the power-supplying members 31 to 33 and acting to disconnect the power-supplying members 31 to 33 from the terminals 23, 24, and 27. Therefore, the disconnection of the power-supplying members 31 to 33 from the terminals 23, 24, and 27 can be prevented.

Furthermore, the use of the metal components 31a to 33a serving as the redirecting portions eliminates the need for providing the redirecting portions in addition to the metal components 31a to 33a.

The metal components 31a each include the flange 31d. The flange 31d is used in pushing the first power-supplying member 31 toward the first terminal 23 when the first power-supplying member 31 is pressure-bonded or thermally pressure-bonded to the first terminal 23 provided in the first terminal hole 23a. The flange 31d has a diameter greater than the diameter of the cable 31f of the first power-supplying member 31. Likewise, the metal components 32a and 33a include the respective flanges 32d and 33d. The flanges of adjacent ones of the first to third power-supplying members 31 to 33 need to be insulated from each other. Therefore, the first terminal holes 23a, the second terminal holes 24a, and the RF terminal hole 27a provided in the ceramic plate 20 need to be arranged farther from one another than the first fitting holes 61, the second fitting holes 62, and the RF fitting hole 63 provided in the installation table 60. Such a configuration is suitable for the application of the present invention.

Even in a case where power-supplying members including no flanges are employed, it is preferable that the first terminal holes 23a, the second terminal holes 24a, and the RF terminal hole 27a provided in the ceramic plate 20 be arranged farther from one another than the first fitting holes 61, the second fitting holes 62, and the RF fitting hole 63 provided in the installation table 60. This is because an area in the ceramic shaft 40 that is near the ceramic plate 20 is more likely to have a high temperature and to cause aerial discharge than an area in the ceramic shaft 40 that is near the installation table 60.

The first power-supplying members 31, the second power-supplying members 32, and the RF power-supplying member 33 are respectively soldered to the first terminals 23a, the second terminals 24a, and the RF terminal 27a. Soldered joints are more likely to be broken when receiving a load than mechanical joints using screws or the like, and are therefore suitable for the application of the present invention.

The present invention is not limited to the above-described embodiment, and can be carried out by various modes as long as they belong to the technical scope of the invention.

Figure 10:
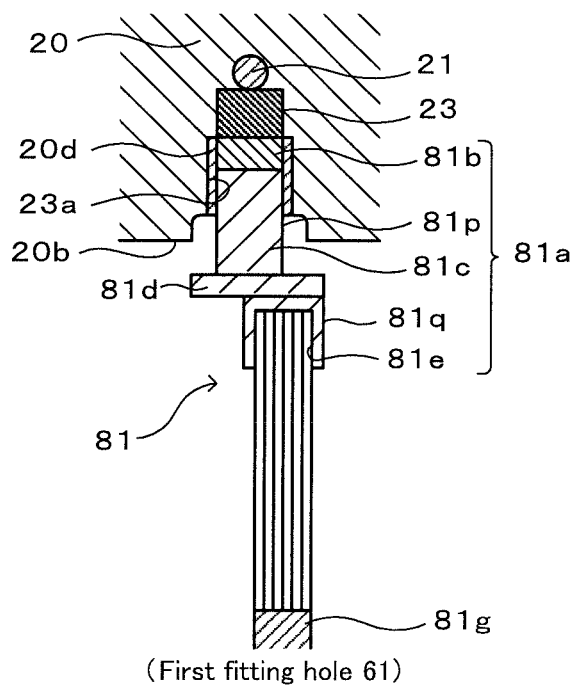
FIG. 10 is a longitudinal sectional view of a first power-supplying member 81, illustrating the distal end thereof and elements therearound.
Figure 11:
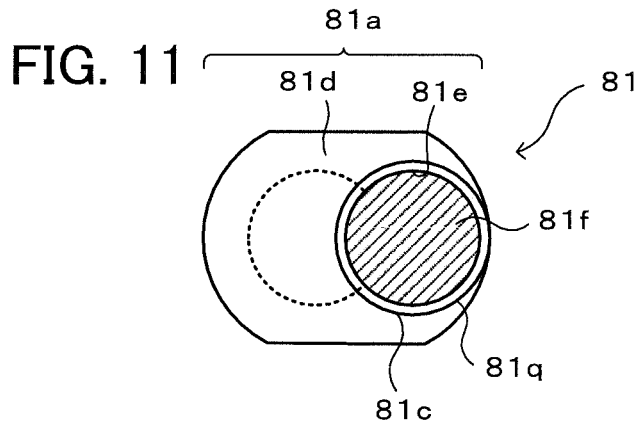
FIG. 11 is a view in direction B represented in FIG. 10.
Figure 12:
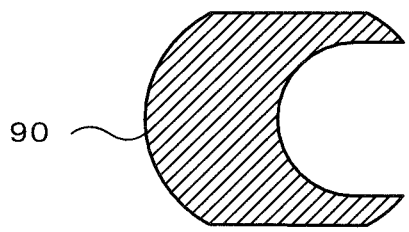
FIG. 12 is a sectional view of a pushing jig 90.

For example, the first power-supplying members 31 employed in the above embodiment may each be replaced with a first power-supplying member 81 illustrated in FIGS. 10 and 11. FIG. 10 is a longitudinal sectional view of the first power-supplying member 81, illustrating the distal end thereof and elements therearound. FIG. 11 is a view in direction B represented in FIG. 10. In FIG. 10, elements that are the same as those described in the above embodiment are denoted by corresponding ones of the reference signs used therein. The first power-supplying member 81 includes a metal component 81a, a cable 81f, and a rod 81g. The distal end of the metal component 81a is fitted into the cylindrical member 20d and is soldered to the first terminal 23. The metal component 81a includes a buffer member 81b and an oxidation-resistant conductive member 81c. The buffer member 81b is the same as the buffer member 31b, and description thereof is omitted. The oxidation-resistant conductive member 81c includes a flange 81d and has an insertion hole 81e. The flange 81d is used in soldering the first power-supplying member 81 to the first terminal 23. The insertion hole 81e receives the cable 81f that is insertable thereinto. The cable 81f is inserted into the insertion hole 81e and is joined to the metal component 81a. A portion (body portion 81p) of the metal component 81a that is nearer to the ceramic plate 20 than the flange 81d extends from the first terminal hole 23a and vertically along the axis of the ceramic shaft 40, as with the body portion 31p. A portion (cable-holding portion 81q) of the metal component 81a that is nearer to the installation table 60 than the flange 81d has the insertion hole 81e. The cable-holding portion 81q is integrated with the body portion 81p while being shifted from the body portion 81p in a direction orthogonal to the axial direction of the ceramic shaft 40. The first fitting hole 61 is positioned vertically below the insertion hole 81e. The cable-holding portion 81q holds the cable 81f while keeping the natural orientation of the cable 81f extending from the first fitting hole 61 and in the axial direction of the ceramic shaft 40. To join the first power-supplying member 81 to the first terminal 23, the distal end face of the metal component 81a and the first terminal 23 are thermally pressure-bonded to each other with solder interposed in between. The pressure is applied by pushing the flange 81d of the metal component 81a toward the first terminal 23 with a stick-like pushing jig 90 having a C-shaped cross section as illustrated in FIG. 12. The first power-supplying member 81 includes no portion where the cable 81f is forcibly bent. Hence, there is no chance that a load (moment) acting to disconnect the first power-supplying member 81 from the first terminal 23 is applied to the joint between the first terminal 23 and the first power-supplying member 81. Therefore, the disconnection of the first power-supplying member 81 from the first terminal 23 can be prevented. The second and third power-supplying members 32 and 33 described above may have the same configuration as the first power-supplying member 81.

Figure 13:
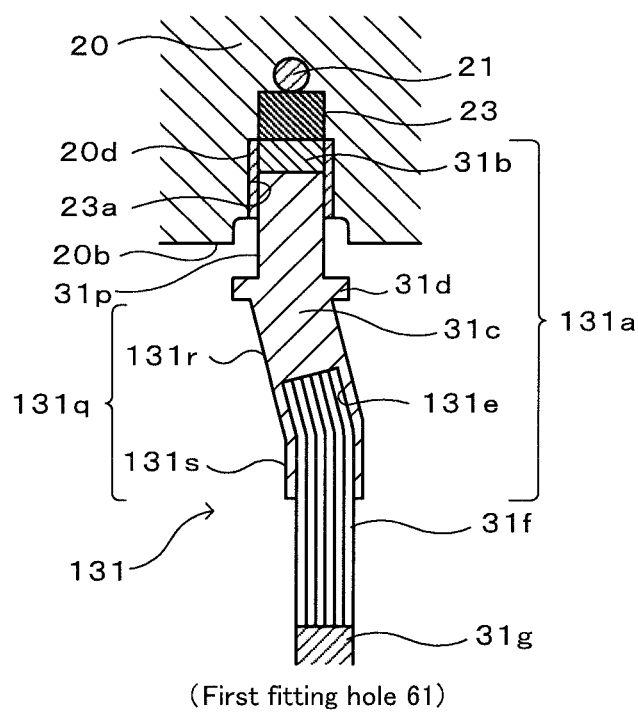
FIG. 13 is a longitudinal sectional view of a first power-supplying member 131, illustrating the distal end thereof and elements therearound.

The first power-supplying members 31 employed in the above embodiment may each be replaced with a first power-supplying member 131 illustrated in FIG. 13. FIG. 13 is a longitudinal sectional view of the first power-supplying member 131, illustrating the distal end thereof and elements therearound. In FIG. 13, elements that are the same as those described in the above embodiment are denoted by corresponding ones of the reference signs used therein. A cable-holding portion 131q of a metal component 131a included in the first power-supplying member 131 includes an inclined part 131r and a vertical part 131s. The inclined part 131r extends downward from the flange 31d and obliquely with respect to the axis of the ceramic shaft 40. The vertical part 131s extends from the lower end of the inclined part 131r and in the axial direction of the ceramic shaft 40. That is, the cable-holding portion 131q is bent. An insertion hole 131e provided in the cable-holding portion 131q is also bent, conforming to the cable-holding portion 131q. Therefore, the cable-holding portion 131q holds the cable 31f while forcibly and obliquely bending the cable 31f extending from the first fitting hole 61 and in the axial direction of the ceramic shaft 40. Thus, the metal component 131a forcibly redirects the first power-supplying member 131, extending from the first fitting hole 61, toward the first terminal hole 23a. With the first power-supplying member 131, the force generated by bending the cable 31f is applied to the cable-holding portion 131q. Hence, there is no chance that a load (moment) acting to disconnect the first power-supplying member 131 from the first terminal 23 is applied to the joint between the first terminal 23 and the first power-supplying member 131. Therefore, the disconnection of the first power-supplying member 131 from the first terminal 23 can be prevented. The second and third power-supplying members 32 and 33 described above may have the same configuration as the first power-supplying member 131.

Figure 14:
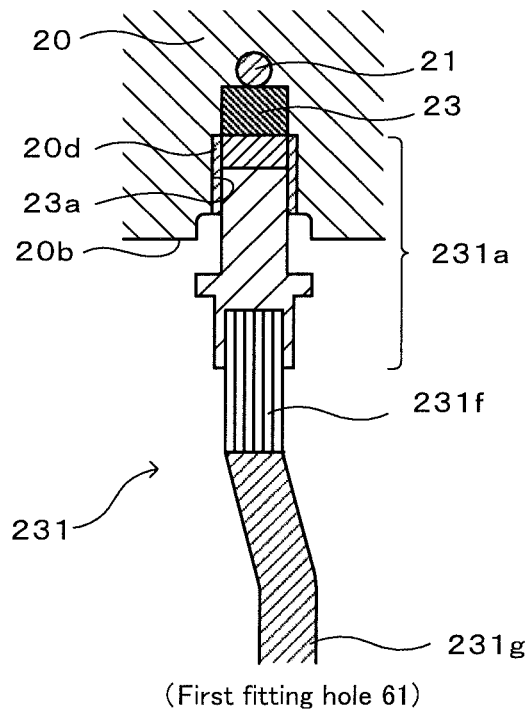
FIG. 14 is a longitudinal sectional view of a first power-supplying member 231, illustrating the distal end thereof and elements therearound.

The above embodiment employs a configuration in which the metal component 31a also serves as the redirecting portion. Alternatively, a configuration illustrated in FIG. 14 may be employed. In FIG. 14, elements that are the same as those described in the above embodiment are denoted by corresponding ones of the reference signs used therein. A metal component 231a illustrated in FIG. 14 does not serve as the redirecting portion and extends vertically. A rod 231g joined to the lower end of a cable 231f extending vertically serves as the redirecting portion that forcibly redirects a first power-supplying member 231 (in this case, the rod 231g itself). The second and third power-supplying members may have the same configuration as the first power-supplying member 231.

The first power-supplying member 31 according to the above embodiment includes the rod 31g joined to the lower end of the cable 31f. The rod 31g may be replaced with an extension of the cable 31f, so that the rod 31g is omitted. Alternatively, the cable 31f may be replaced with an extension of the rod 31g, so that the cable 31f is omitted. This also applies to the second and third power-supplying members 32 and 33.

In the above embodiment, the centers of the two first terminal holes 23a, the centers of the two second terminal holes 24a, and the center of the one RF terminal hole 27a are positioned on the circumference C1 of the circle having the diameter D1. Meanwhile, the centers of the two first fitting holes 61, the centers of the two second fitting holes 62, and the center of the one RF fitting hole 63 are positioned on the circumference C2 of the circle having the diameter D2

(<D1). The present invention is not limited to such a case. As long as each of the terminal holes and a corresponding one of the fitting holes are shifted from each other in plan view, the centers of all terminal holes do not necessarily need to be positioned on the circumference of a common circle. Furthermore, the centers of all fitting holes do not necessarily need to be positioned on the circumference of a common circle. Alternatively, while the pair of each of the first terminal holes 23a, which receive the first power-supplying members 31, and a corresponding one of the first fitting holes 61 are shifted from each other in plan view, the pair of each of the second terminal holes 23b and a corresponding one of the second fitting holes 62 and the pair of the RF terminal hole 27a and the RF fitting hole 63 do not necessarily need to be shifted from each other in plan view. In such a case, only the first power-supplying members 31 need to be redirected by the respective metal components 31a (redirecting portions).

In the above embodiment, the ceramic plate 20 may include an electrostatic electrode embedded therein. In such a case, when a voltage is applied to the electrostatic electrode after a wafer W is placed on the wafer placement surface 20a, the wafer W can be electrostatically attracted to the wafer placement surface 20a. The electrostatic electrode is provided with a power-supplying member extending from a power-source-side fitting hole (a hole having the center positioned on the circumference C2 illustrated in FIG. 4). The power-supplying member is also held by a redirecting portion in such a manner as to be forcibly redirected toward a terminal hole provided in the ceramic plate 20 (a hole having the center positioned on the circumference C1 illustrated in FIG. 4).

In the above embodiment, the RF electrode 26 is connected to the RF power source. Alternatively, while the RF electrode 26 is grounded, the shower head (not illustrated) may be connected to the RF power source. Moreover, in the above embodiment, the RF electrode 26 may be omitted.

In the above embodiment, the first and second zones Z1 and Z2 are each a single solid zone. Alternatively, at least one of the first and second zones Z1 and Z2 may be sectioned into a plurality of small zones. In such a case, the resistance heating element (heater electrode) is provided in each of the small zones and independently of one another, with power-supplying members attached to two respective ends of the resistance heating element. Such power-supplying members extend from respective power-source-side fitting holes (holes having the centers positioned on the circumference C2 illustrated in FIG. 4) and are held by respective redirecting portions in such a manner as to be forcibly redirected toward respective terminal holes provided in the ceramic plate 20 (holes having the centers positioned on the circumference C1 illustrated in FIG. 4).

In the above embodiment, the metal components 31a to 33a each also serve as the redirecting portion. Alternatively, the metal component and the redirecting portion may be provided as separate members.

The present application claims priority from Japanese Patent Application No. 2020-174774 filed Oct. 16, 2020, the entire contents of which are incorporated herein by reference.

What is claimed is:

1. A wafer placement table comprising:
   a ceramic plate having a wafer placement surface;
   an electrode embedded in the ceramic plate;
   a hollow ceramic shaft attached to a surface of the ceramic plate, the surface being opposite the wafer placement surface;
   a power-supplying member running inside the ceramic shaft and connected to a terminal of the electrode, the power-supplying member conveying power from a power source to the electrode;
   a plate-side attaching site defined on the ceramic plate and to which the power-supplying member is attached, the plate-side attaching site being defined in an area enclosed by the ceramic shaft and in correspondence with the terminal of the electrode; and
   a power-source-side attaching site defined at a free end of the ceramic shaft and to which the power-supplying member is attached, the power-source-side attaching site being defined in correspondence with the plate-side attaching site and in such a manner as to be shifted from the plate-side attaching site in plan view,
   wherein the power-supplying member includes a redirecting portion and a flange near the ceramic plate, wherein the power-supplying member extending from the power-source-side attaching site is forcibly redirected toward the plate-side attaching site, and wherein the flange is adaptable for pushing the power-supplying member toward the electrode terminal during the soldering of the power-supplying member to the terminal of the electrode,
   wherein the power-supplying member includes a metal component and a cable, the metal component being joined to the terminal of the electrode, the cable being joined to the metal component and extending from the metal component to the power-source-side attaching site, the metal component serving as the redirecting portion,
   wherein the metal component includes a body portion extending from the plate-side attaching site and in an axial direction of the ceramic shaft; and a cable-holding portion integrated with the body portion while being shifted from the body portion in a direction orthogonal to the axial direction of the ceramic shaft, the cable-holding portion holding the cable while keeping a natural orientation of the cable extending from the power-source-side attaching site and in the axial direction of the ceramic shaft, and wherein no portion of the cable is forcibly bent;
   wherein the electrode is one of a plurality of electrodes including a heater electrode, and
   wherein the power-supplying member including a flange, a metal component and a cable is one of a plurality of power-supplying members including a flange, a metal component and a cable respectively connected to the terminals of the plurality of electrodes.

2. The wafer placement table according to claim 1, wherein the plate-side attaching site is one of a plurality of plate-side attaching sites defined in the area and in correspondence with the terminals of the plurality of electrodes,
   wherein the power-source-side attaching site is one of a plurality of power-source-side attaching sites defined in correspondence with the plurality of plate-side attaching sites, with at least one of the plurality of power-source-side attaching sites being shifted from a corresponding one of the plate-side attaching sites in plan view, and
   wherein the redirecting portion is provided to one of the plurality of power-supplying members that extends between the power-source-side attaching site and the plate-side attaching site that are shifted from each other.

3. The wafer placement table according to claim 2, wherein the plurality of power-source-side attaching sites are all shifted from the respective plate-side attaching sites in plan view.

4. The wafer placement table according to claim 1, wherein the power-supplying member is soldered to the terminal of the electrode.

5. The wafer placement table according to claim 1, wherein the power-supplying member further includes a buffer member at a distal end of the member and connected to the terminal of the electrode.

\* \* \* \* \*